United States Patent
Yamazaki et al.

(10) Patent No.: US 7,113,027 B2
(45) Date of Patent: Sep. 26, 2006

(54) SEMICONDUCTOR INTEGRATED CIRCUIT DEVICE

(75) Inventors: Masafumi Yamazaki, Kawasaki (JP); Toshiya Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/104,501

(22) Filed: Apr. 13, 2005

(65) Prior Publication Data

US 2005/0201186 A1   Sep. 15, 2005

Related U.S. Application Data

(63) Continuation of application No. PCT/JP03/05961, filed on May 13, 2003.

(51) Int. Cl.
*G05F 1/10* (2006.01)

(52) U.S. Cl. ........................ 327/541; 327/540

(58) Field of Classification Search ............... 327/530, 327/536, 537, 540, 541, 543; 307/43
See application file for complete search history.

(56) References Cited

U.S. PATENT DOCUMENTS

| | | | |
|---|---|---|---|
| 6,356,499 B1* | 3/2002 | Banba et al. | 365/226 |
| 6,452,438 B1* | 9/2002 | Li | 327/536 |
| 6,476,665 B1* | 11/2002 | Buchschacher | 327/536 |
| 2003/0210089 A1* | 11/2003 | Tanzawa et al. | 327/536 |
| 2004/0017247 A1* | 1/2004 | Yasui et al. | 327/536 |
| 2004/0246044 A1* | 12/2004 | Myono et al. | 327/536 |
| 2005/0007185 A1* | 1/2005 | Kamijo | 327/536 |

FOREIGN PATENT DOCUMENTS

| | | |
|---|---|---|
| EP | 0 669 619 A2 | 2/1995 |
| JP | 56-12859 A | 2/1981 |
| JP | 7-78472 A | 3/1995 |
| JP | 2000-40394 A | 2/2000 |
| JP | 2000-194329 A | 7/2000 |
| JP | 2000-350439 A | 12/2000 |
| JP | 2001-178115 A | 6/2001 |

* cited by examiner

Primary Examiner—Terry D. Cunningham
(74) Attorney, Agent, or Firm—Arent Fox PLLC

(57) ABSTRACT

A semiconductor integrated circuit device has a boosted-voltage power-supply circuit generating a boosted voltage, an internal circuit being driven with the boosted voltage, and a control circuit controlling the internal circuit by receiving the boosted voltage. The boosted-voltage power-supply circuit has a first output terminal for the internal circuit, and a second output terminal for the control circuit. The boosted voltage output from the second terminal has a specified level regardless of variation in the boosted voltage being output from the first terminal.

7 Claims, 10 Drawing Sheets

SEMICONDUCTOR INTEGRATED CIRCUIT DEVICE

CROSS-REFERENCE TO RELATED APPLICATION

This application is a continuation application and is based upon PCT/JP03/05961, filed on May 13, 2003.

BACKGROUND OF THE INVENTION

1. Field of the Invention

The present invention relates to a semiconductor integrated circuit device and, in particular, it relates to a semiconductor integrated circuit device that uses an output voltage boosted by a boosted-voltage power-supply circuit for an internal circuit and to a control circuit that controls the internal circuit.

2. Description of the Related Art

In recent years, semiconductor integrated circuit devices have been mounted on various portable apparatuses and their power supply voltage has been reduced. In the semiconductor integrated circuit devices driven by a low voltage, boosted-voltage power-supply circuits are used so that the semiconductor integrated circuit devices are operated by output voltages boosted by the boosted-voltage power-supply circuits.

Incidentally, for example, in a DRAM (Dynamic Random Access Memory), at power-up, a boosted-voltage power-supply circuit is activated first and, then, after the potential of the boosted-output voltage (the boosted voltage) of the boosted voltage power supply circuit reaches a specified level, a reduced-voltage power-supply circuit, using the output voltage, operates to reduce the boosted voltage and apply the reduced voltage to a control circuit so that the control circuit can perform reset operations for an internal circuit (for example, redundant operations for failed memory cells, and the like). Further, besides the DRAM, various semiconductor integrated circuit devices using the output voltage (boosted voltage) boosted by the boosted-voltage power-supply circuit for the internal circuit and for the control circuit that controls the internal circuit are provided. In this connection, in some semiconductor integrated circuit devices, the voltage that is reduced from the boosted voltage by the reduced-voltage power-supply circuit is not applied to the control circuit but the boosted voltage is applied directly.

In such semiconductor integrated circuit device (chip) using the boosted-voltage power-supply for controlling the internal reduced-voltage power-supply, for example, if any circuits using the intra-chip boosted voltage (the output voltage of the boosted-voltage power-supply circuit) have leakage resulted from manufacturing processes, it is possible that the potential of the output of the boosted-voltage power-supply circuit may not be increased sufficiently. In this case, for example, in the DRAM, even if the circuits causing the leakage are provided with redundant functions and designed so that such circuits can be isolated by reset operations upon activation of the internal circuit (power-on resets), such circuits cannot be reset and cannot operate properly.

Further, though it is possible to provide a plurality of boosted-voltage power-supply circuits for each circuit, it is not desirable because the number of elements for the boosted-voltage power-supply circuits and, thus, an area occupied by the elements are increased.

The conventional semiconductor integrated circuit device and its problems will be described in detail below with reference to the drawings.

SUMMARY OF THE INVENTION

The present invention has been made in view of the problems of the prior art described above and, thus, according to a semiconductor integrated circuit device of the present invention, it is an object of the present invention to provide a semiconductor integrated circuit device that can be initialized properly even if there is leakage of a boosted voltage within a chip (within an internal circuit).

According to the present invention, there is provided a semiconductor integrated circuit device comprising: a boosted-voltage power-supply circuit for generating a boosted voltage; an internal circuit being driven by the boosted voltage; and a control circuit for controlling said internal circuit by receiving said boosted voltage, wherein said boosted-voltage power-supply circuit has: a first output terminal for said internal circuit; and a second output terminal for said control circuit.

Here, the semiconductor integrated circuit device of the present invention comprises, for example, a reduced-voltage power-supply circuit that reduces the boosted voltage supplied via the second output terminal of the boosted-voltage power-supply circuit and applies the reduced voltage to the control circuit.

In the present invention, the boosted voltage (a boosted-voltage power-supply line) for the internal circuit and the boosted voltage for the control circuit are separated by providing the boosted-voltage power-supply circuit with an output terminal dedicated for the boosted voltage for controlling the control circuit (the reduced-voltage power-supply circuit), so that the control circuit can operate normally to perform initialization even if there is leakage of the boosted voltage in the internal circuit.

Further, the semiconductor integrated circuit device can be designed so that the two boosted voltages are separated only during the initializing operation and, as a result, stabilizing capacitances (smoothing capacitances) can be shared and an area occupied by the capacitances can be reduced. Still further, the output terminals of each boosted voltage can be provided with respective diodes in the forward direction to eliminate a backflow of current.

BRIEF DESCRIPTION OF THE DRAWINGS

Hereinafter, the present invention will be described with reference to the accompanying drawings, in which.

DESCRIPTION OF THE PREFERRED EMBODIMENTS

Figure 1:
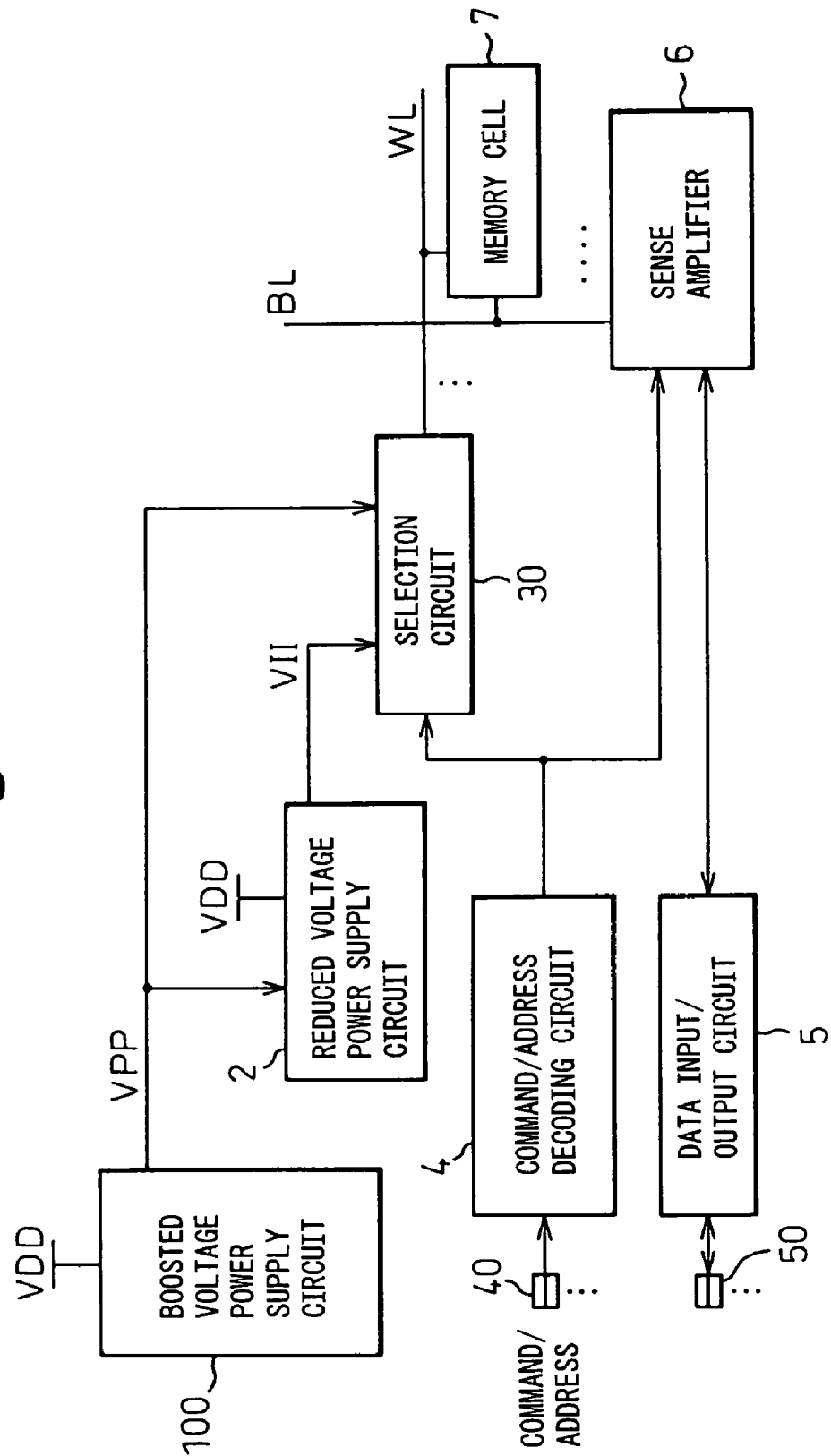
FIG. 1 is a block diagram schematically showing a DRAM as an example of a semiconductor integrated circuit device.
Figure 2:
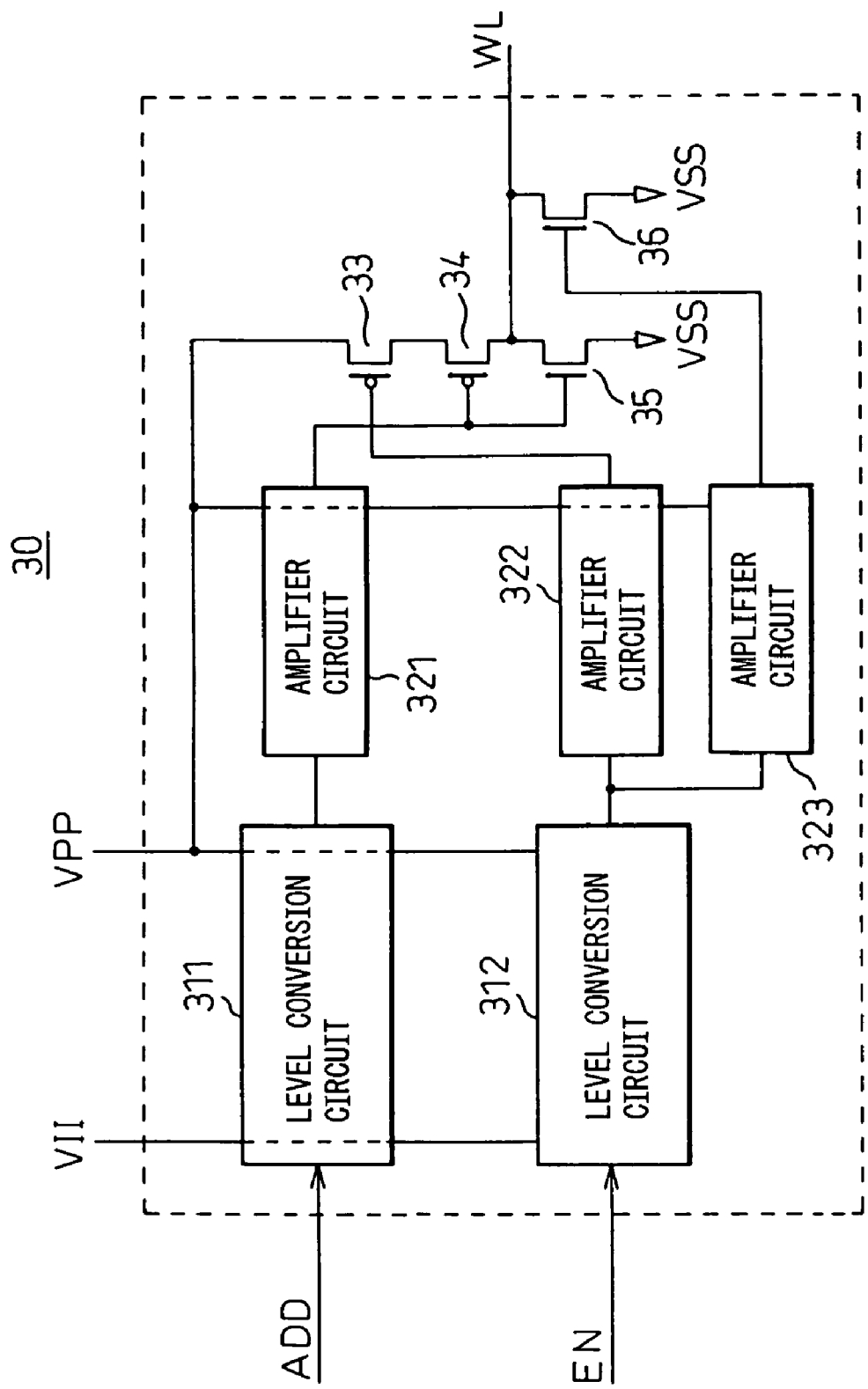
FIG. 2 is a block diagram schematically showing an example of a memory cell selection circuit in the DRAM of FIG. 1.
Figure 3:
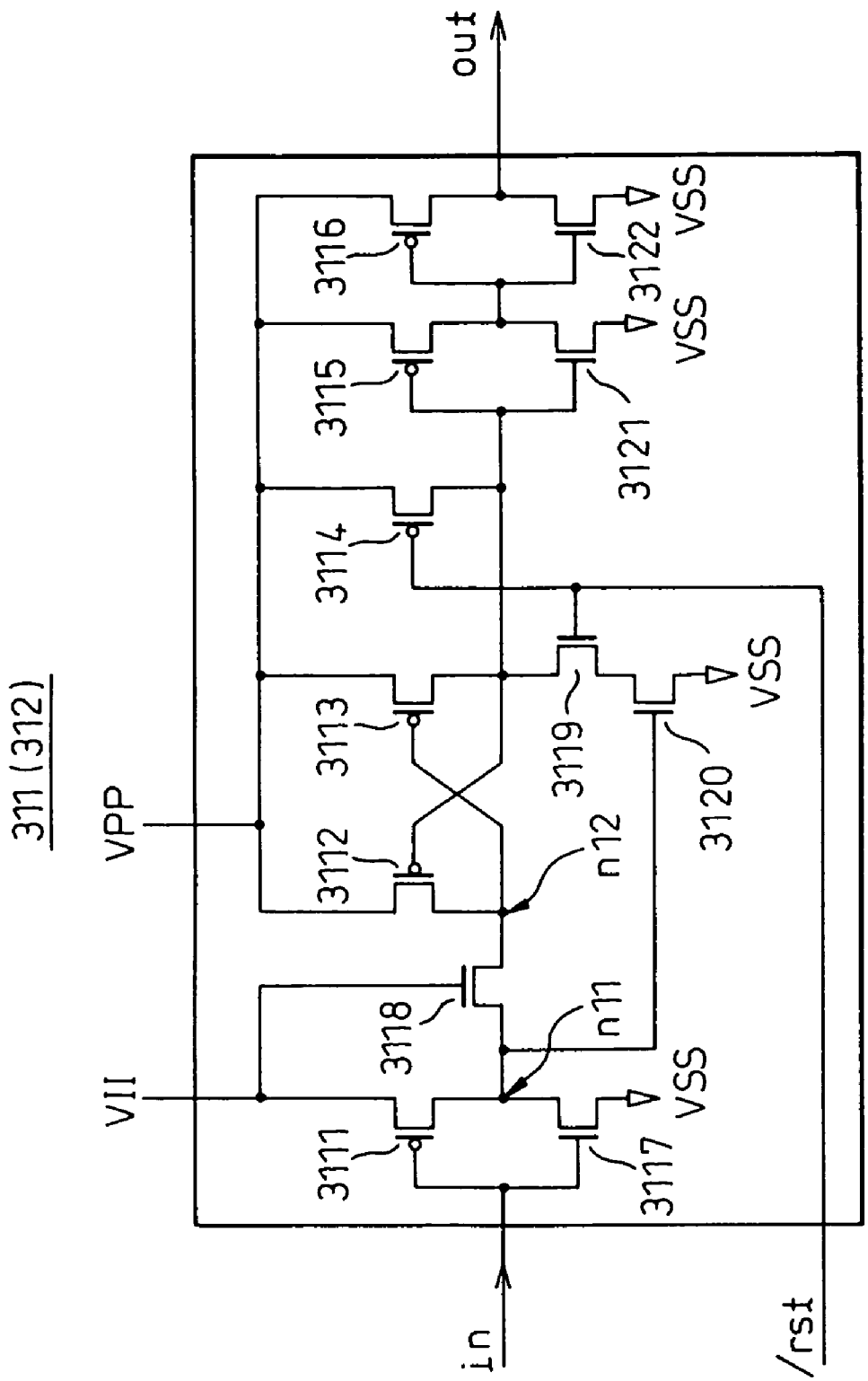
FIG. 3 is a circuit diagram showing an example of a level conversion circuit in the selection circuit of FIG. 2.

First, before describing embodiments of a semiconductor integrated circuit device according to the present invention, a conventional semiconductor integrated circuit device and its problems will be described in detail with reference to the accompanying drawings (FIGS. 1 to 3).

FIG. 1 is a block diagram schematically showing a DRAM as an example of a semiconductor integrated circuit device that mainly describes only a part of a conventional DRAM in relation to the present invention. FIG. 1 shows a boosted-voltage power-supply circuit 100, a reduced-voltage power-supply circuit 2, a selection circuit (control circuit) 30, a command/address decoding circuit 4, a command/address terminal 40, a data input/output circuit 5, a data terminal 50, a sense amplifier 6, and a memory cell 7. Further, FIG. 1 shows a high-potential power-supply voltage VDD (for example, 1.8 V±0.2 V), a low-potential power-supply voltage VSS (for example, 0 V), a boosted voltage VPP (an output voltage of the boosted-voltage power-supply circuit 100: for example, 3.2 to 3.6 V), a reduced voltage VII (an output voltage of the reduced-voltage power-supply circuit 2: for example, 1.6 to 1.8 V), bit lines BL, and word lines WL.

A command/address signal from the outside is supplied to the command/address decoding circuit 4 via the command/address terminal 40 to select a word line WL corresponding to the address signal via the selection circuit 30 and to select a bit line BL corresponding to the address signal via the sense amplifier 6 so that a specified memory cell 7 is accessed. Write data from the outside is supplied via the data terminal 50, the data input/output circuit 5 and the write amplifier (sense amplifier) 6 to the memory cell 7 that is accessed according to the address signal and, on the other hand, read data from the memory cell 7 is outputted to the outside via the sense amplifier 6, the data input/output circuit 5 and the data terminal 50. Here, it is to be noted that the selection circuit 30 performs not only the typical word line selecting operations described above but also redundant operations for failed memory cells, which will be described below.

FIG. 2 is a block diagram schematically showing an example of the memory cell selection circuit in the DRAM of FIG. 1.

As shown in FIG. 2, the selection circuit 30 comprises an address signal level conversion circuit 311 to which an address signal ADD is inputted, a command signal level conversion circuit 312 to which an activation signal (command signal: enabling signal) EN is inputted, amplifier circuits 321 to 323, p-channel MOS transistors (pMOS transistors) 33, 34, and n-channel MOS transistors (nMOS transistors) 35, 36. Here, it is to be noted that both the boosted voltage VPP and the reduced voltage VII are applied to the level conversion circuits 311 and 312.

The level conversion circuit 311 is used for controlling the transistors 34 and 35 via the amplifier circuit 321 to select the word line WL corresponding to the address signal ADD, while the level conversion circuit 312 is used for controlling the transistors 33 and 36 via the amplifier circuits 322 and 323, respectively, to activate the selection circuit 30. More specifically, the nMOS transistor 35 is turned on in response to a high level "H" signal from the amplifier circuit 322 and the nMOS transistor 36 is turned off in response to a low level "L" signal from the amplifier circuit 323 and, further, the low level "L" signal from the amplifier circuit 321 is inverted by the transistors 34 and 35 to select the word line WL (the high level "H").

FIG. 3 is a circuit diagram showing an example of the level conversion circuit in the selection circuit of FIG. 2.

As shown in FIG. 3, the level conversion circuit 311 (312) is comprised of a plurality of pMOS transistors 3111 to 3116, and a plurality of nMOS transistors 3117 to 3122. Here, the transistors 3111 and 3117, 3115 and 3121, and 3116 and 3122 constitute respective CMOS inverters. Further, the reference numeral n11 designates an output node of the inverter 3111, 3117 and the reference numeral n12 designates an input node of the inverter 3115, 3121.

In the level conversion circuit 311 shown in FIG. 3, first, the nMOS transistor 3118 shuts off the current flowing through the boosted-voltage power-supply line (VPP), the node n12, the node n11 and the reduced-voltage power-supply line (VII) when the pMOS transistor 31112 is turned on. On the other hand, a reset signal /rst supplied to the gate of the nMOS transistor 3119 and the pMOS transistor 3114 is at the low level "L" at the time of activation and otherwise at the level of the boosted voltage VPP to ensure that the output signal out is at the low level "L" at the time of activation. However, due to the fact that the reset signal /rst also passes through the level conversion circuit, if the reduced voltage VII is not at a proper level, the reset signal /rst may also become unstable.

More specifically, if the level conversion circuit for generating the reset signal /rst does not have the transistors 3119, 3114, the reduced voltage VII may be unstable and, as a result, the output signal out (namely, the reset signal /rst) may stay near the level of the boosted voltage VPP when the boosted voltage VPP is increased. Though the level conversion circuit is typically designed so that the driving ability of the pMOS transistor 3112 is smaller than that of the transistor 3113 to prevent the above-described problem at the time of activation, the driving ability of the transistor 3113 may be reduced significantly and may even become smaller than that of the transistor 3112 due to deposition of particles in manufacturing processes and for other reasons.

Further, in each of a large number of level conversion circuits that are designed so that the driving ability of the transistor 3112 is smaller than that of the transistor 3113, if a large number of word lines WL are selected, the application of the boosted-voltage VPP may be delayed due to the large capacity of the word lines WL. Still further, if some of the selected word lines are defective and have leakage to the low potential power supply line (VSS) that is normally not used, the boosted voltage VPP may not even be applied.

These selection signals are principally turned off for all the word lines WL at the time when the reduced voltage VII is applied and the inputs to the level conversion circuits are fixed.

As described above, in the semiconductor integrated circuit device using the boosted-voltage power-supply for controlling the internal reduced-voltage power-supply, for example, if there is leakage resulted from manufacturing processes, for example, in the DRAM, the circuits causing the leakage cannot be reset and cannot operate properly even if such circuits are provided with redundant functions and are designed so that such circuits can be isolated by reset operations upon activation of the internal circuit.

Hereinafter, embodiments of a semiconductor integrated circuits device according to the present invention will be described in detail with reference to the accompanying drawings.

Figure 4:
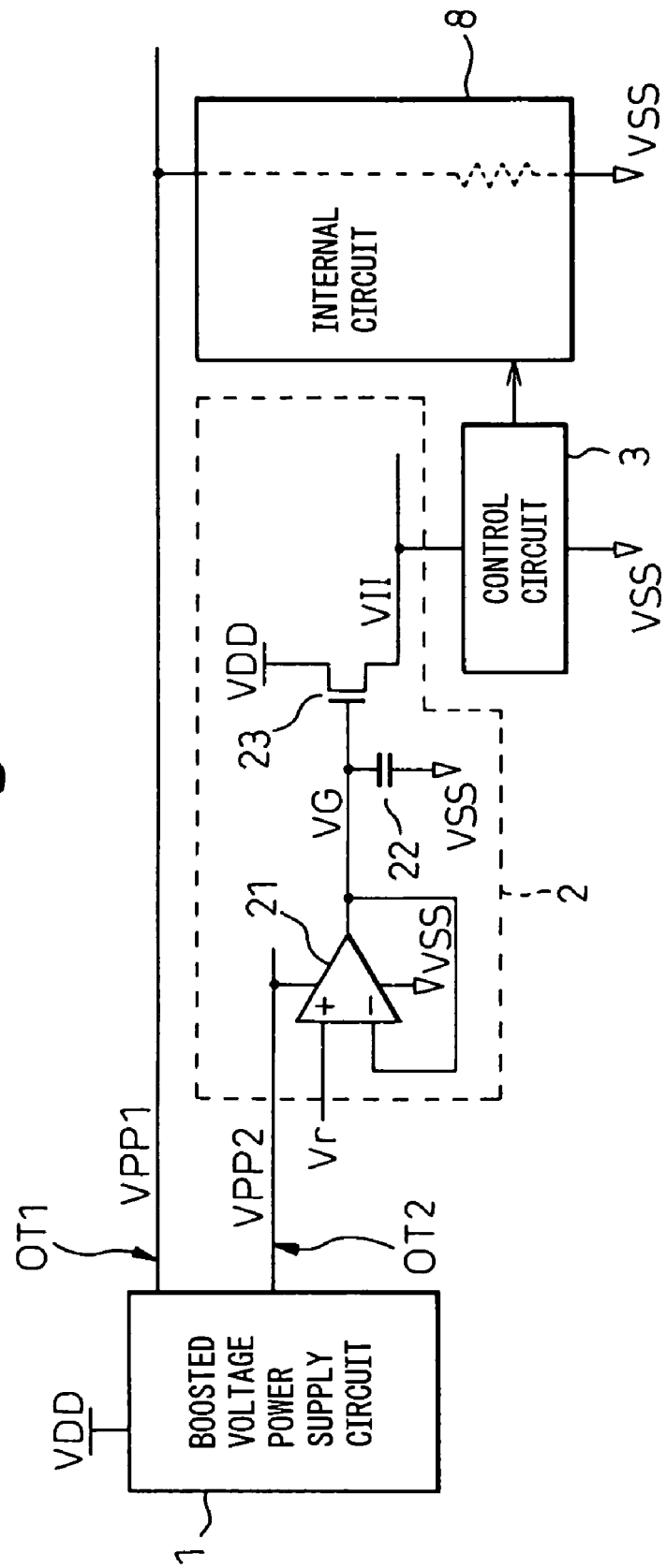
FIG. 4 is a block diagram conceptually showing a configuration of a main part of a semiconductor integrated circuit device according to the present invention.

FIG. 4 is a block diagram conceptually showing a configuration of a main part of a semiconductor integrated circuit device according to the present invention. FIG. 4 shows a boosted-voltage power-supply circuit 1, a reduced-voltage power-supply circuit 2, a control circuit 3, and an internal circuit 4. Further, FIG. 4 shows a high potential power supply voltage VDD (for example, 1.8 V±0.2 V), a low potential power supply voltage VSS (for example, 0 V), boosted voltages VPP1 and VPP2 (output voltages of the boosted-voltage power-supply circuit 1: for example, 3.2 to 3.6 V), a reduced voltage VII (an output voltage of the reduced-voltage power-supply circuit 2: for example, 1.6 to 1.8 V), and an internal voltage VG in the reduced-voltage power-supply circuit 2.

The semiconductor integrated circuit device according to the present invention comprises the boosted-voltage power-supply circuit 1 for generating the boosted voltages VPP1, VPP2, the internal circuit driven by the boosted voltage VPP1, and the control circuit 3 for controlling the internal circuit 8 by receiving the boosted voltage VPP2. The boosted-voltage power-supply circuit 1 comprises a first output terminal OT1 for applying the boosted voltage VPP1 to the internal circuit 8, and a second output terminal OT2 for applying a specified voltage (the reduced voltage VII) to the control circuit 3 via the reduced-voltage power-supply circuit 2.

As shown in FIG. 4, the reduced-voltage power-supply circuit 2 comprises, for example, a differential amplifier (operational amplifier) 21, a capacitance 22, and an nMOS transistor 23. The differential amplifier 21 outputs a specified internal voltage VG (that is higher than the high potential power supply voltage VDD) according to a reference voltage Vr supplied to its positive input terminal and the internal voltage VG is applied to the gate of the nMOS transistor 23 to output the reduced and stabilized voltage VII (for example, a constant voltage in the range between 1.6 to 1.8 V). Here, it is to be noted that the capacitance 22 acts to smooth (stabilize) the output voltage of the differential amplifier 21.

Here, it is to be noted that the boosted-voltage power-supply circuit 1 in the semiconductor integrated circuit device according to the present invention comprises an output voltage control section that outputs the boosted voltage VPP2 from the second terminal OU2 at a specified level regardless of variation (for example, voltage drop due to leakage in the internal circuit 8) of the boosted voltage VPP1 outputted from the first terminal OT1, as will be described in detail below.

Figure 5:
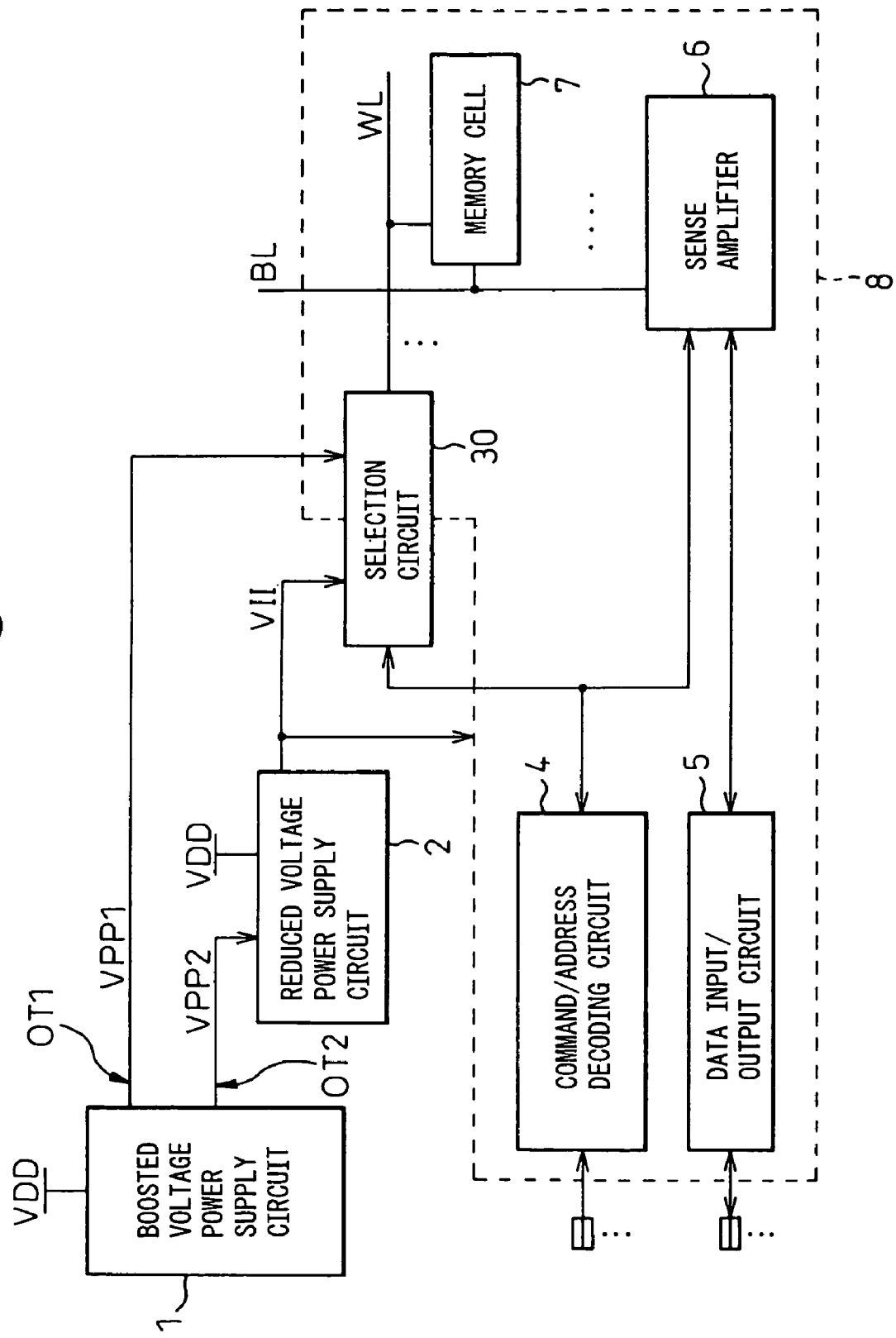
FIG. 5 is a block diagram schematically showing a DRAM as an embodiment of a semiconductor integrated circuit device according to the present invention.

FIG. 5 is a block diagram schematically showing a DRAM as an embodiment of a semiconductor integrated circuit device according to the present invention.

As apparent from a comparison with the conventional DRAM shown in FIG. 1 described above, or as having been described above with reference to FIG. 4, in the DRAM of this embodiment, the boosted-voltage power-supply circuit 1 has the first output terminal OT1 for outputting the first boosted voltage VPP1, and the second output terminal OT2 for outputting the second boosted voltage VPP2. Here, it is to be noted that the first boosted voltage VPP1 is applied to the internal circuit 8 and the second boosted voltage VPP2 is applied to the selection circuit (control circuit) 30. Further, it is to be noted that the selection circuit sections corresponding to the internal circuit 8 to which the first boosted voltage VPP1 is applied and the control circuit (3) to which the second boosted voltage VPP2 is applied. Still further, the output voltage of the reduced-voltage power-supply circuit 2 (the reduced voltage) VII is also supplied to the internal circuit 8 and, for example, used by the command/address decoding circuit 4, the data input/output circuit 5, the sense amplifier 6 and so on. Still further, it is of course to be understood that the internal circuit 8 may include various circuits in addition to the command/address decoding circuit 4, the data input/output circuit 5, the sense amplifier 6 and the memory cells 7.

Figure 6:
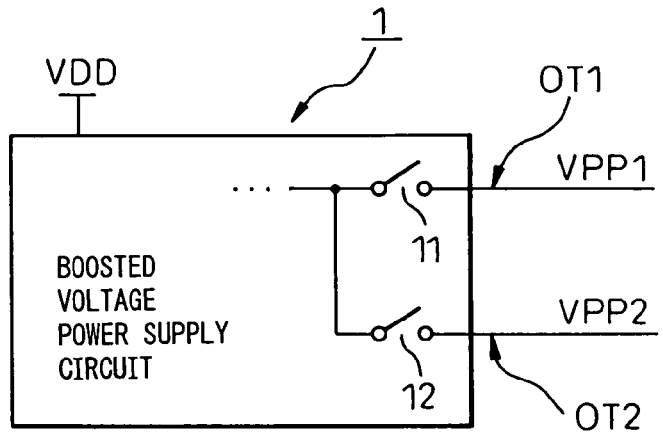
FIG. 6 is a block diagram conceptually showing a configuration of a boosted-voltage power-supply circuit in a semiconductor integrated circuit device according to the present invention.

FIG. 6 is a block diagram conceptually showing a configuration of a boosted-voltage power-supply circuit in a semiconductor integrated circuit device according to the present invention.

As shown in FIG. 6, a boosted-voltage power-supply circuit 1 comprises a first switch 11 connected in series with the first output terminal OT1, and a second switch 12 connected in series with the second output terminal OT2.

Figure 7:
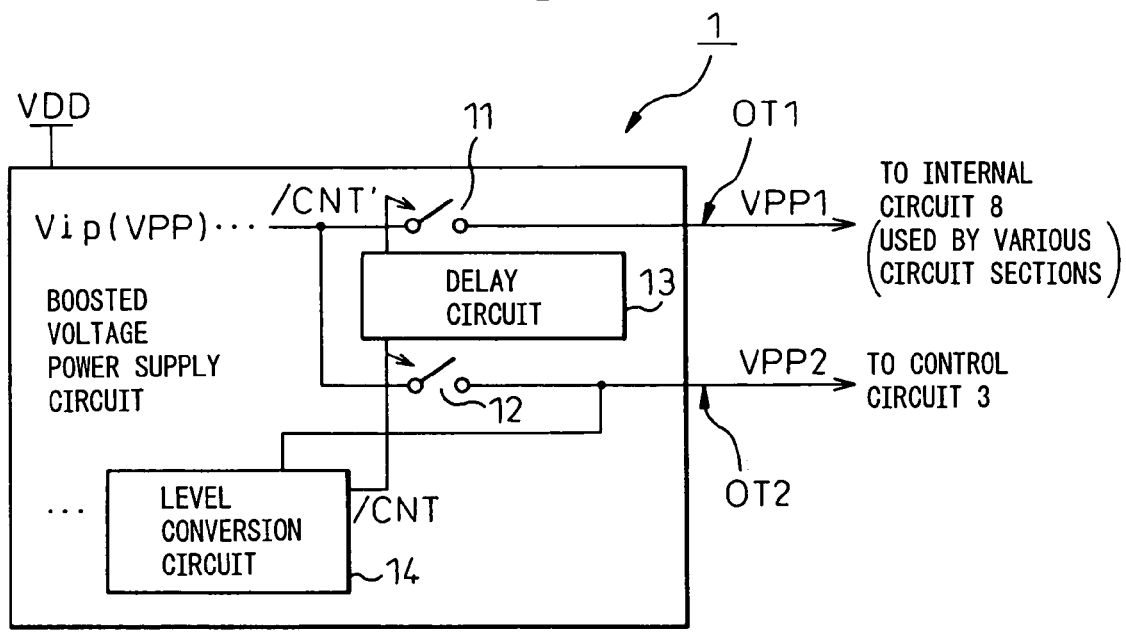
FIG. 7 is a block diagram showing an example of the boosted-voltage power-supply circuit of FIG. 6.

FIG. 7 is a block diagram showing an example of the boosted-voltage power-supply circuit of FIG. 6.

As shown in FIG. 7, the boosted-voltage power-supply circuit 1 comprises the first switch 11, the second switch 12, a delay circuit, and a level conversion circuit 14. The first and second switches 11, 12 are controlled by output signals /CNT (/CNT') of the level conversion circuit 14. Here, it is to be noted that the control signal /CNT' supplied to the first switch 11 is a signal delayed from the control signal /CNT supplied to the second switch 12 by means of the delay circuit 13.

The boosted-voltage power-supply circuit 1 generates the boosted voltage Vip (VPP) boosted from the power supply voltage (VDD) in a manner similar to that in the boosted-voltage power-supply circuit (100) in the conventional semiconductor integrated circuit device described above with reference to FIG. 1. Further, this boosted voltage Vip is outputted from the first output terminal OT1 via the first switch 11 as the first boosted voltage VPP1 for the internal circuit 8 and, on the other hand, it is output from the second output terminal OT2 via the second switch 12 as the second boosted voltage VPP2 for the control circuit 3. Then, the first and second switches 11, 12 are controlled by the output signals /CNT (/CNT') of the level conversion circuit 14.

More specifically, the second switch 12 is controlled by the control signal /CNT from the level conversion circuit 14 and the first switch 11 is controlled by the control signal /CNT' that is delayed from the control signal /CNT, which is supplied to the second switch 12, by means of the delay circuit 13.

Figure 8:
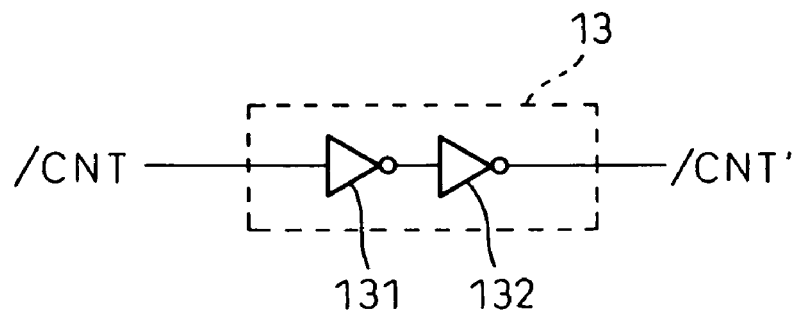
FIG. 8 is a diagram showing an example of a delay circuit in the boosted-voltage power-supply circuit of FIG. 7.

FIG. 8 is a diagram showing an example of the delay circuit in the boosted-voltage power-supply circuit of FIG. 7. As shown in FIG. 8, the delay circuit 8 is comprised of a plurality (an even number) of cascaded inverters 131, 132 so that the control signal /CNT', which is delayed from the control signal /CNT supplied to the second switch 12 by means of the inverters 131, 132, is supplied to the first switch 11.

Therefore, when the semiconductor integrated circuit device (for example, the DRAM) is turned on, the second switch 12 is turned on to supply the boosted voltage VPP2 to the control circuit 3 (the reduced-voltage power-supply circuit 2) before the first switch 11 is turned on to supply the boosted voltage VPP1 to the internal circuit 8 and, as a result, even if there are circuits causing leakage (for example, failed word lines having leakage) in the internal circuit 8, the control circuit 3 can be operated normally to perform operations for isolating the circuits causing the leakage mentioned above and the like (for example, redundant operations for blocking the failed word lines and switching to spare word lines).

Here, it is to be noted that the first boosted voltage VPP1 and the second boosted voltage VPP2 are at the same potential, for example, and, therefore, after the operation for activating the semiconductor integrated circuit device described above is completed, the first output terminal OT1 and the second output terminal OT2 can be short-circuited to increase the power supply capacitance (smoothing capacitance) of the boosted voltage.

Figure 9:
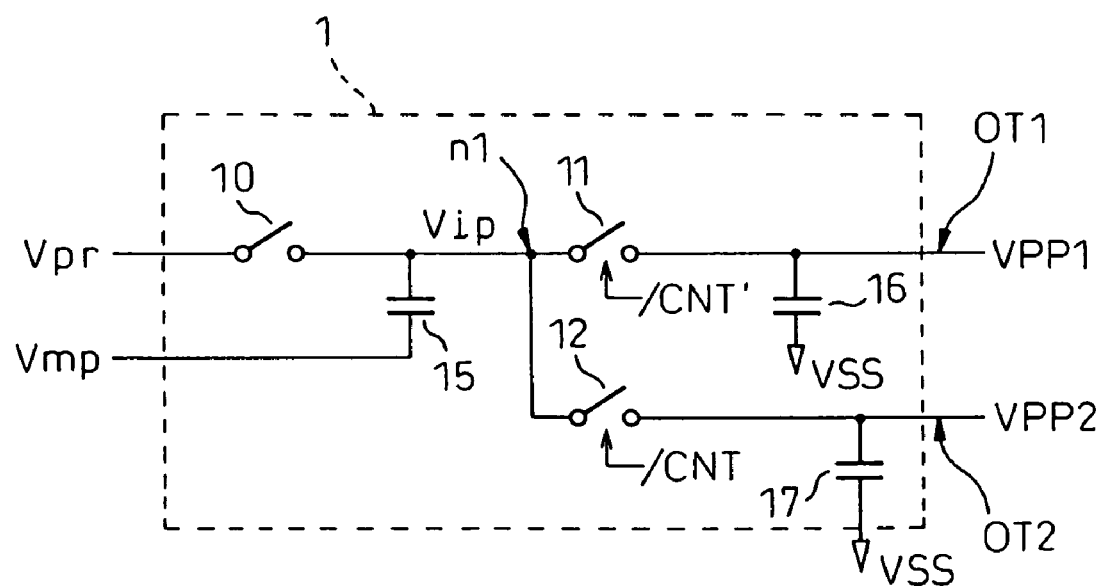
FIG. 9 is a circuit diagram showing a first embodiment of a configuration of a main part of a boosted-voltage power-supply circuit in a semiconductor integrated circuit device according to the present invention.
Figure 10:
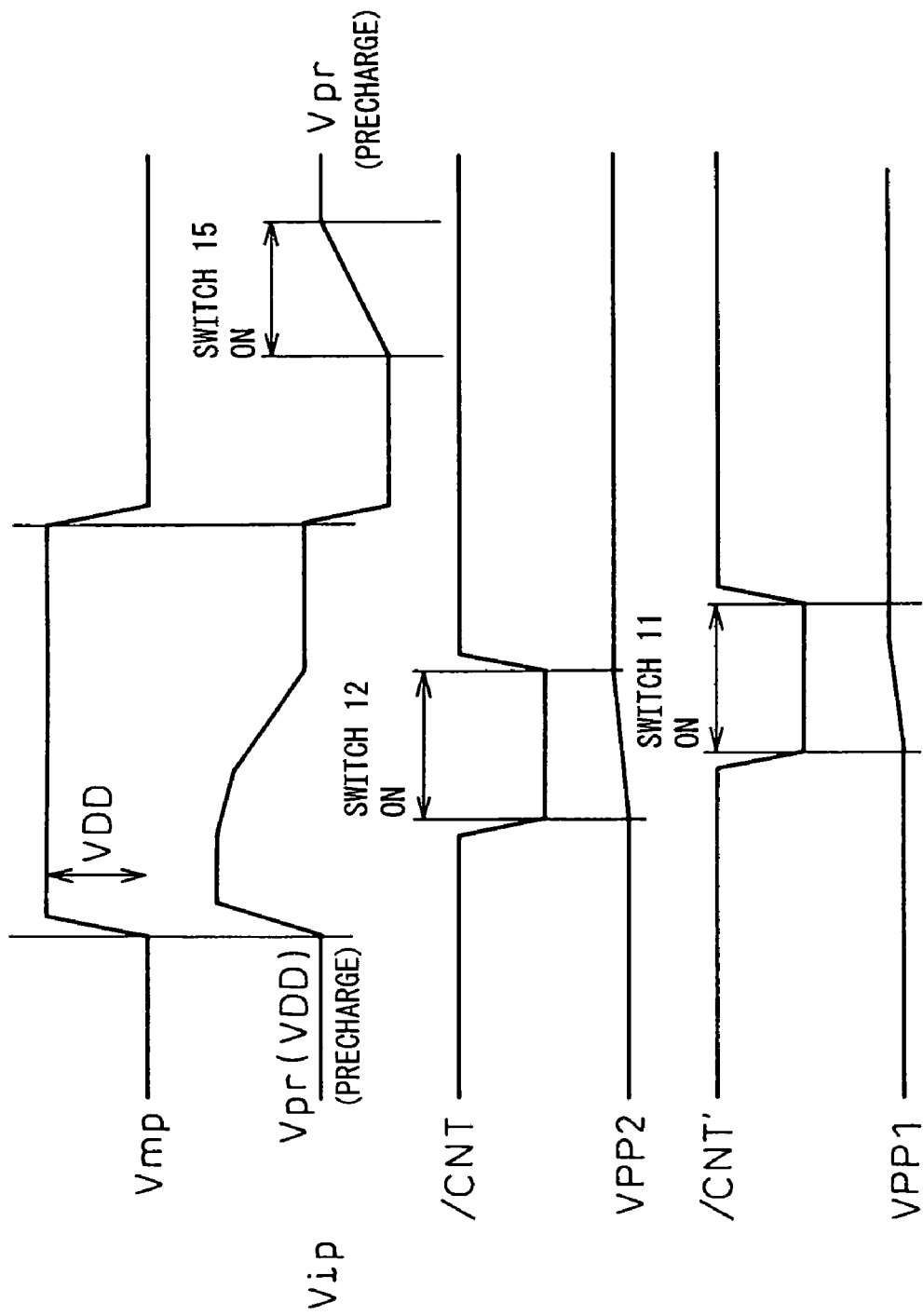
FIG. 10 is a schematic waveform chart for describing operations of the boosted-voltage power-supply circuit of FIG. 9.

FIG. 9 is a circuit diagram showing a first embodiment of a configuration of a main part of a boosted-voltage power-supply circuit in a semiconductor integrated circuit device according to the present invention, and FIG. 10 is a schematic waveform chart for describing operations of the boosted-voltage power-supply circuit of FIG. 9. Though a case in which the boosted-voltage power-supply circuit 1 boosts the high potential power supply voltage twice (VDD× 2) will be described hereinafter, it is of course to be understood that the present invention may also be applied similarly to cases in which the high-potential power-supply voltage is boosted differently and is, for example, tripled (VDD×3).

As shown in FIG. 9, the boosted-voltage power-supply circuit 1 of this first embodiment comprises switches 10, 11, 12 and capacitances 15, 16, 17. As shown in FIGS. 9 and 10, first, in the state in which the switch 10 is turned on and the switches 11 and 12 are turned off, a node n1 is precharged from a precharge potential (Vpr: it is equal to VDD, for example). At this time, a pump voltage Vmp is equal to VSS (0 V).

Next, the switch 10 is turned off and the potential of the pump voltage Vmp is increased so that the potential of the node n1 is increased to VDD (for example, VDD×2). Then, the switch (second switch) 12 is turned on by the control signal /CNT and, next, the switch (first switch) 11 is turned on by the delayed control signal /CNT'. Therefore, the second boosted voltage VPP 2 is applied to the reduced-voltage power-supply circuit 2 via the second switch 12 before the first boosted voltage VPP1 is applied via the first switch 11 and, then, the output voltage (reduced voltage) VII of the reduced-voltage power-supply circuit 2 is applied to the control circuit 3 (the selection circuit 30) to operate the control circuit 3.

According to this configuration, for example, also in the level conversion circuit shown in FIG. 3, because the reduced voltage VII is applied first to fix the inputs to the level conversion circuit, for example, the redundant operations for failed sections (sections having leakage resulted from manufacturing processes) in the DRAM can be performed properly at the time of activation. Thus, for example, in the semiconductor integrated circuit device using the boosted voltage for controlling the internal reduced-voltage power-supply, even if there is leakage in the circuits using the intra-chip boosted voltage, a proper voltage can be applied to the control circuit so that the control circuit can perform normal control operations.

Here, as described above, it is to be noted that the first boosted voltage VPP1 (the boosted voltage applied to the reduced-voltage power-supply circuit 2) and the second boosted voltage VPP2 (the boosted voltage applied to the internal circuit 8) are at the same potential, for example, and, therefore, after the operation for activating the semiconductor integrated circuit device described above is completed, the first output terminal OT1 and the second output terminal OT2 are short-circuited to increase the power supply capacitance of the boosted voltage.

Figure 11:
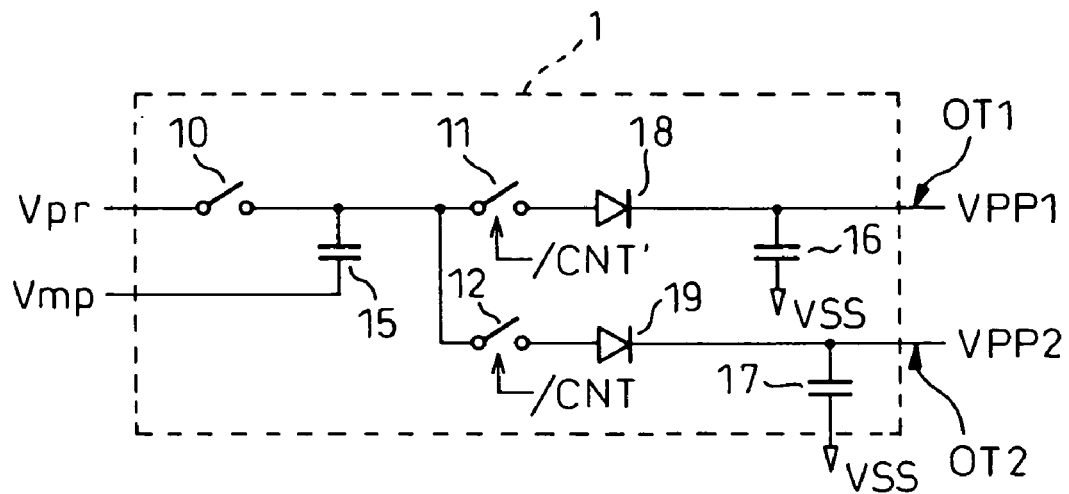
FIG. 11 is a circuit diagram showing a second embodiment of a configuration of a main part of a boosted-voltage power-supply circuit in a semiconductor integrated circuit device according to the present invention.

FIG. 11 is a circuit diagram showing a second embodiment of a configuration of a main part of a boosted-voltage power-supply circuit in a semiconductor integrated circuit device according to the present invention.

As apparent from FIG. 11, in the boosted-voltage power-supply circuit in the semiconductor integrated circuit device of this second embodiment, a first diode 18 is provided in series with the first switch 11 in the forward direction and a second diode 19 is provided in series with the second switch 12 in the forward direction. As a result, for example, when the first output terminal OT1 and the second output terminal OT2 are short-circuited after the operation for activating the semiconductor integrated circuit device is completed, a backflow of current can be prevented and the boosted voltages VPP (VPP1, VPP2) can be generated efficiently.

Figure 12:
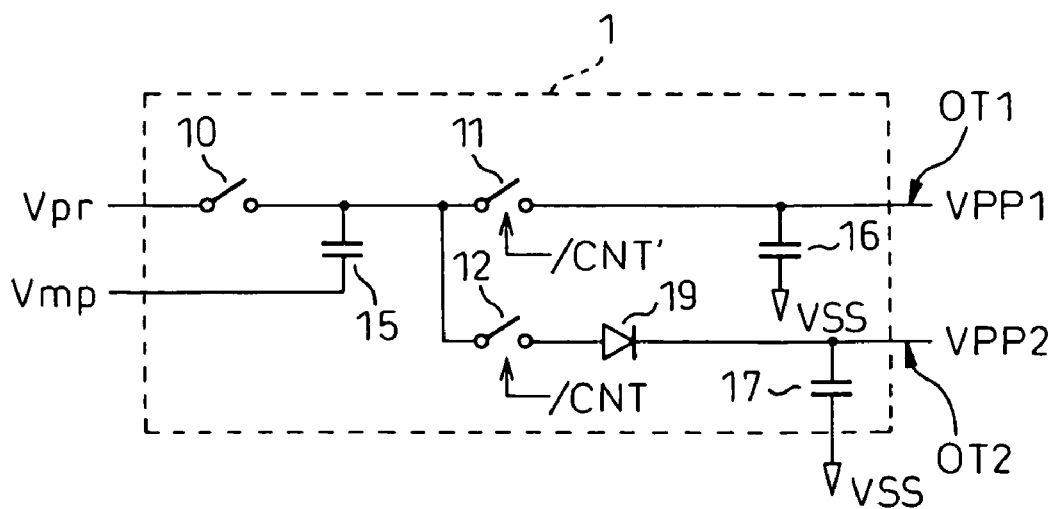
FIG. 12 is a circuit diagram showing a third embodiment of a configuration of a main part of a boosted-voltage power-supply circuit in a semiconductor integrated circuit device according to the present invention.

FIG. 12 is a circuit diagram showing a third embodiment of a configuration of a main part of a boosted-voltage power-supply circuit in a semiconductor integrated circuit device according to the present invention.

As apparent from a comparison between FIG. 12 and FIG. 11, in the boosted-voltage power-supply circuit in the semiconductor integrated circuit device of this third embodiment, only the second switch 12 is provided with the second diode 19. Here, the boosted-voltage power-supply circuit may be designed so that only the first switch 11 is provided with the first diode 18.

Figure 13:
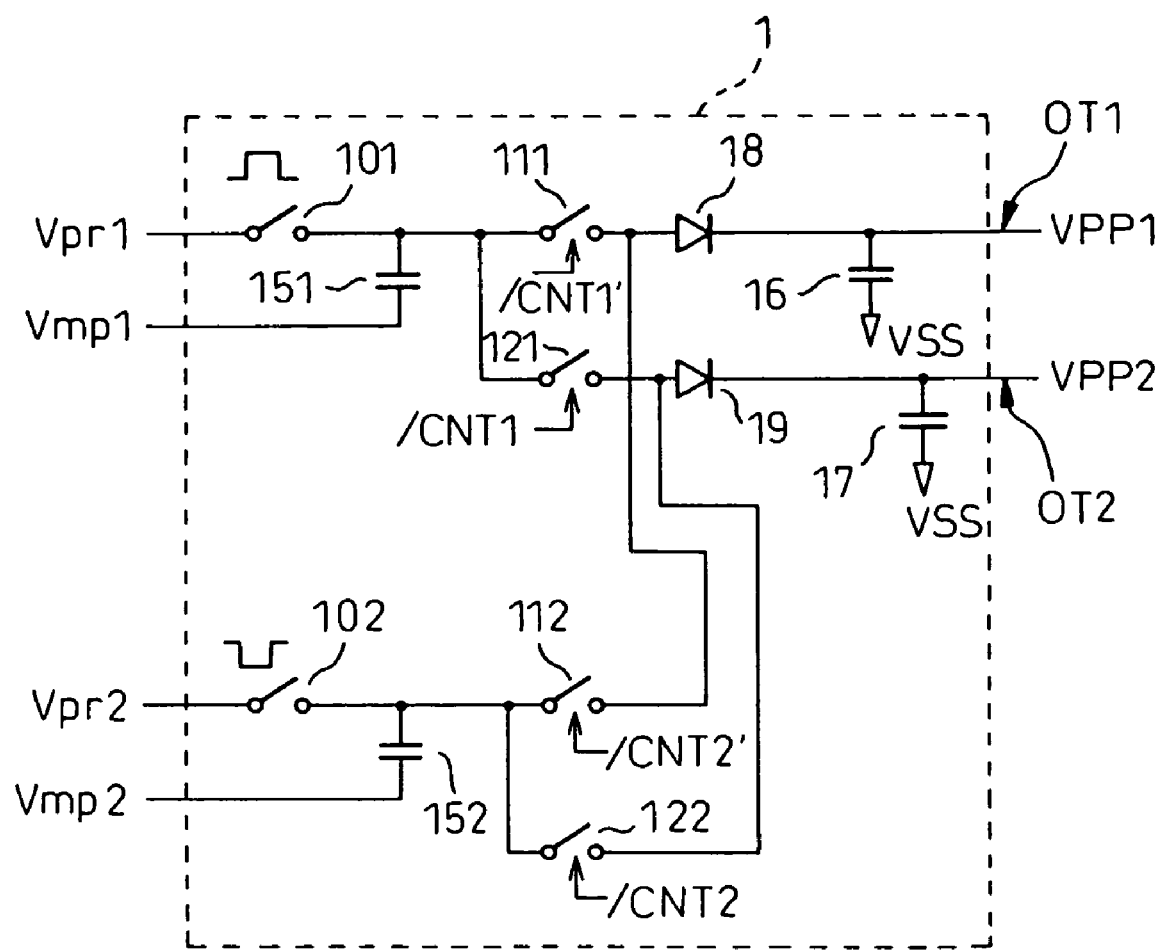
FIG. 13 is a circuit diagram showing a fourth embodiment of a configuration of a main part of a boosted-voltage power-supply circuit in a semiconductor integrated circuit device according to the present invention.

FIG. 13 is a circuit diagram showing a fourth embodiment of a configuration of a main part of a boosted-voltage power-supply circuit in a semiconductor integrated circuit device according to the present invention.

As shown in FIG. 13, in the boosted-voltage power-supply circuit in the semiconductor integrated circuit device of this fourth embodiment, two sets of boost circuit sections (two sets of boost circuit sections, one of which comprises switches 101, 111, 112 and a capacitance 151, and the other of which comprises switches 102, 112, 122 and a capacitance 152) operating alternately is provided so that boosting operations can be performed efficiently.

Here, the switches 101, 111, 112 of the first boost circuit section and the switches 102, 112, 122 are configured to operate with a phase difference of 180 degrees. Further, control signals /CNT1' and /CNT2' for controlling the first switches 111 and 112 of each set are delayed from control signals /CNT1 and /CNT2 for controlling the second switches 121 and 122 of each set, respectively. Still further, precharge voltages Vpr1, Vpr2 and pump voltages Vmp1, Vmp2 are set at the same potential, respectively. This boosted-voltage power-supply circuit may be configured in various ways.

Thus, it is, of course, to be understood that the boosted-voltage power-supply circuit, the reduced-voltage power-supply circuit, the control circuit and the internal circuit in the semiconductor integrated circuit device according to the embodiments described above may also be configured in various ways.

As described above, in the semiconductor integrated circuit device according to the present invention, even if there is leakage of the boosted voltage in the chip, an initializing operation can be performed properly. Further, because the capacitances (smoothing capacitances) can be used in combination with each other by short-circuiting the two boosted voltages, an area occupied by the capacitors can be reduced. Still further, the output terminals of the boosted voltages can be provided with the diodes so that a backflow of current can be prevented and the boosted voltages can be obtained efficiently.

What is claimed is:

1. A semiconductor integrated circuit device comprising:
   a boosted-voltage power-supply circuit for generating a boosted voltage;
   an internal circuit being driven by the boosted voltage;
   a control circuit for controlling said internal circuit by receiving said boosted voltage; and
   a reduced-voltage power-supply circuit for reducing said boosted voltage, wherein:
   said boosted-voltage power-supply circuit comprises a first output terminal for said internal circuit; a second output terminal for said control circuit; and an output voltage control section that outputs said boosted voltage from said second output terminal at a specified level regardless of variation of said boosted voltage outputted from said first output terminal; and
   said reduced-voltage power-supply circuit reduces said boosted voltage supplied via the second output terminal of said boosted-voltage power-supply circuit and applies it to said control circuit.

2. The semiconductor integrated circuit device as claimed in claim 1, wherein said boosted voltage outputted from said first terminal is also applied to said control circuit.

3. The semiconductor integrated circuit device as claimed in claim 2, wherein said output voltage control section comprises a first switch connected in series with said first output terminal; and a second switch connected in series with said second output terminal.

4. The semiconductor integrated circuit device as claimed in claim 3, wherein said output voltage control section further comprises a first smoothing capacitance provided at a stage subsequent to said first switch; and a second smoothing capacitance provided at a stage subsequent to said second switch.

5. The semiconductor integrated circuit device as claimed in claim 3, wherein said output voltage control section further comprises at least one of: a first diode provided in series with said first switch in the forward direction; and a second diode provided in series with said second switch in the forward direction.

6. The semiconductor integrated circuit device as claimed in claim 3, wherein said output voltage control section further comprises a delay circuit for delaying the timing to turn on said first switch from the timing to turn on said second switch.

7. The semiconductor integrated circuit device as claimed in claim 1, wherein said first and second output terminals are separated only at the time of activation of the semiconductor integrated circuit device and, once the semiconductor integrated circuit device is activated, said first and second output terminals are electrically short-circuited.

* * * * *